(12) United States Patent
Mizuta

(10) Patent No.: US 6,242,929 B1
(45) Date of Patent: *Jun. 5, 2001

(54) PROBE NEEDLE FOR VERTICAL NEEDLE TYPE PROBE CARD AND FABRICATION THEREOF

(75) Inventor: Masaharu Mizuta, Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/061,042

(22) Filed: Apr. 16, 1998

(30) Foreign Application Priority Data

Nov. 10, 1997 (JP) ...................................... 9-307065

(51) Int. Cl.⁷ ...................................... G01R 31/02
(52) U.S. Cl. ........................................... 324/754; 324/761
(58) Field of Search .................. 324/72.5, 754, 324/755, 761; 439/482, 824, 66, 82; 257/676

(56) References Cited

U.S. PATENT DOCUMENTS

| | | | |
|---|---|---|---|
| 3,866,999 | * 2/1975 | Doherty, Jr. ........................ | 439/70 |
| 4,035,722 | * 7/1977 | Ryabov et al. ..................... | 324/72.5 |
| 5,015,947 | * 5/1991 | Chism ................................. | 324/72.5 |
| 5,218,292 | * 6/1993 | Goto .................................... | 324/761 |
| 5,367,254 | * 11/1994 | Faure et al. ......................... | 324/761 |
| 5,801,441 | * 9/1998 | DiStefano et al. .................. | 257/696 |

FOREIGN PATENT DOCUMENTS

| | | |
|---|---|---|
| 2-99362 | 8/1990 | (JP) . |
| 6-49994 | 7/1994 | (JP) . |
| 7-029838 | 6/1995 | (JP) . |
| 7-029839 | 6/1995 | (JP) . |

* cited by examiner

*Primary Examiner*—Vinh P. Nguyen
(74) *Attorney, Agent, or Firm*—McDermott, Will & Emery

(57) ABSTRACT

A probe needle for a vertical needle type probe card is obtained that allows testing of electrical characteristics to be carried at high accuracy and that has high durability to reduce exchange work and cost. The configuration of a probe needle is formed to have a first bending portion bent towards a first lateral direction and a second bending portion bent towards a second lateral direction opposite to the first lateral direction at substantially 180° thereto. The stress exerted on the probe needle can be absorbed by the two bending portions at the left and right side. The deviation in the axis direction of the leading end of the probe needle can be reduced. Also, folding and bending of the probe needle can be prevented.

6 Claims, 5 Drawing Sheets

PROBE NEEDLE FOR VERTICAL NEEDLE TYPE PROBE CARD AND FABRICATION THEREOF

BACKGROUND OF THE INVENTION

1. Field of the Invention

The present invention relates to a probe needle for a probe card and a fabrication method thereof. More particularly, the present invention relates to a probe needle for a vertical needle type probe card and a fabrication method thereof.

2. Description of the Background Art

Among the processes of fabricating an IC, an LSI and the like, a wafer test process is known to test whether each chip on a wafer is an acceptable product or not. In this wafer testing, a probe card is generally attached to a device called a prober. The test is carried out by placing the probe needle of the probe card on a predetermined pad (electrode) on the wafer chip (referred to as overdrive operation) with at least a predetermined pressure (referred to as stylus pressure) to form contact. More specifically, a probe card is developed to test the electrical characteristics of a semiconductor device in the fabrication process of a semiconductor device. This probe card includes the conventional vertical needle type probe card. Particularly, a cobra probe card developed by IBM has attracted a wide range of attention, and is now beginning to be used for practical usage.

FIG. 8 is a schematic diagram showing a conventional cobra probe card. Referring to FIG. 8, the upper end of a cobra type probe needle 101 is attached in a vertical manner to an upper guide plate 102 in this conventional probe card. Also, a lower guide plate 103 for positioning an electrode 109 that will form contact with probe needle 101 is located beneath upper guide plate 102. A through hole 104 is provided in lower guide plate 103 to guide probe needle 101. The upper end of probe needle 101 is connected to a terminal (not shown) arranged around upper guide plate 102 via a wiring (not shown). The leading end of probe needle 101 forms contact with electrode 106 provided at the surface of a semiconductor device that is the subject of testing. This probe card is used to test the electrical characteristics of a semiconductor device.

FIG. 9 is a schematic diagram for describing an operation of the probe needle of the cobra probe card shown in FIG. 8. Referring to FIG. 9, an external force 105 is exerted to bring probe needle 101 in contact with electrode 109. External force 105 is exerted onto this probe card in the direction indicated by the arrow in FIG. 9. When leading end 107 of probe needle 101 is in contact with electrode 109, a portion 108 fixed to upper guide plate 102, a portion 106 guided by lower guide plate 103, a bent portion 111 absorbing the stress, and leading end portion 107 of probe needle 101 in contact with electrode 109 are arranged as shown in FIG. 9.

The above-described probe needle 101 of the conventional cobra type probe card has two problems set forth in the following.

The first problem is that a great deflection is generated at bending portion 111 when leading end 107 of probe needle 101 is brought into contact with electrode 109 since bending portion 111 is formed so as to absorb the stress at that one portion. When leading end 107 of probe needle 101 is brought into contact with electrode 109, probe needle 101 will contact the side surface of through hole 104 in lower guide plate 103. As a result, the side surface of through hole 104 is scraped to generate scraps. The scraps will block through hole 104 to degrade the passage of probe needle 101. Furthermore, probe needle 101 will be caught at the side surface of through hole 104 due to the friction between probe needle 101 and through hole 104. There is a possibility that probe needle 101 will be stuck in through hole 104 so as not to protrude therefrom. Therefore, the height level of each leading end 107 of each the plurality of probe needles 101 will differ to result in step-graded levels. This means that there is variation in the penetration pressure of probe needle 101 to project into an aluminum oxide film (not shown) formed on electrode 109. The contact pressure between electrode 109 and leading end 107 of probe needle 101 will become improper, so that testing of the electrical characteristics cannot be carried out at high accuracy.

The second problem is that the stress is concentrated at one bending portion 111 of probe needle 101 when leading end 107 of probe needle 101 forms contact with electrode 109 since probe needle 101 is formed so that the stress is absorbed at only one bending portion 111. Repetitive usage with the stress always concentrated at one location will cause metal fatigue due to the repetitive loading. Probe needle 101 was sometimes broken into two pieces or permanently bent. Thus, the lifetime of probe needle 101 becomes shorter. This was not cost effective since extra cost is required for the exchange.

SUMMARY OF THE INVENTION

One object of the present invention is to provide a probe needle for a vertical needle type probe card that allows testing of electrical characteristics at higher accuracy.

Another object of the present invention is to provide a probe needle for a vertical needle type probe card that has high durability and that can reduce the exchange work and cost.

According to an aspect of the present invention, a probe needle for a vertical needle type probe card includes a bending portion. The bending portion includes a first bending portion that is bent towards a first lateral direction, and a second bending portion that is bent towards a second lateral direction that is opposite to the first lateral direction at approximately 180 degrees. By this structure, deflection is generated equally in the left and right directions in the probe needle of the present invention in contrast to a conventional cobra probe needle that has only one bending portion. The possibility of the leading end of the probe needle being within an axis identical to the initial one becomes higher. Furthermore, in contrast to the conventional cobra type probe needle having only one bending portion at which the stress exerted on the probe needle is absorbed, the probe needle of the present invention can have the exerted stress absorbed by at least two bending portions. Therefore, the resiliency of the entire probe needle increases. The probe needle of the present invention allows the contact pressure between the probe needle and the electrode to be substantially constant since deviation of the leading end portion is smaller than that of the conventional prove needle. Thus, a test result of higher accuracy can be obtained. Also, increase in the resiliency allows a greater stress to be absorbed. As a result, the possibility of being broken or permanently bent is reduced. The durability of the probe needle of the present invention is increased to result in a lower running cost.

According to the above-described structure, the radius of curvature of the first bending portion can be set greater than the radius of curvature of the second bending portion. This allows the rigidity to be increased than that of a probe needle having a bending portion of the same radius of curvature.

The possibility of the probe needle being broken or bent becomes lower. Also, deviation of the leading end portion becomes smaller than that of a probe needle with first and second bending portion of the same radius of curvature.

Preferably, at least the first and second bending portions are formed of a sheet strip. This means that the portion absorbing the stress is sheet-like, and is bent in only one direction at the generation of a bending stress. By setting this bending direction so as to avoid an adjacent probe needle, the possibility of a bent probe needle contacting another adjacent probe needle is eliminated. Thus, accurate testing can be carried out.

Also, the first and second bending portions can have a bending shape of either substantially a S shape or a W shape. By providing a bending portion having a simple configuration of a S shape or a W shape, the probe needle of the present invention can be provided more inexpensively than that of a complicated needle shape. Furthermore, the time required for fabrication can be relatively shorter.

Further preferably, the first and second bending portions are formed of metal having shape memory property. This allows the probe needle of the present invention to be always restored to a constant shape with no residual strain. Therefore, the probe needle can be inserted or pulled out while maintaining a straight shape. The bending configuration is restored to the former shape by applying a heat treatment at the state installed at the guide plate. Therefore, the probe needle of the present invention can save the exchange work and cost, so that the running cost can be reduced.

According to another aspect of the present invention, a method of fabricating a probe needle for a vertical needle type probe card includes the steps of smelting and casting at least two types of metals, the step of sintering and molding the cast metal so as to include a first bending portion bent towards a first lateral direction and a second bending portion bent towards a second lateral direction opposite to the first lateral direction at approximately 180 degrees, and the step of applying a heat treatment on the cast metal so as to have shape memory property. By the fabrication method of the present invention, a probe needle can be provided that exhibits no buckling or deformation, and particularly improved in the spring characteristics. By applying a shape memory property, the probe needle can be inserted or drawn out in a straight shape. The former spring characteristics can be exhibited by restoring the bending configuration by applying a heat treatment in the state installed to the guide plate. According to the fabrication method of the present invention, the durability of the probe needle can be improved by increasing the resiliency. The exchange work and cost can be saved to reduce the running cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to FIGS. 1–7.

First Embodiment

Figure 1:
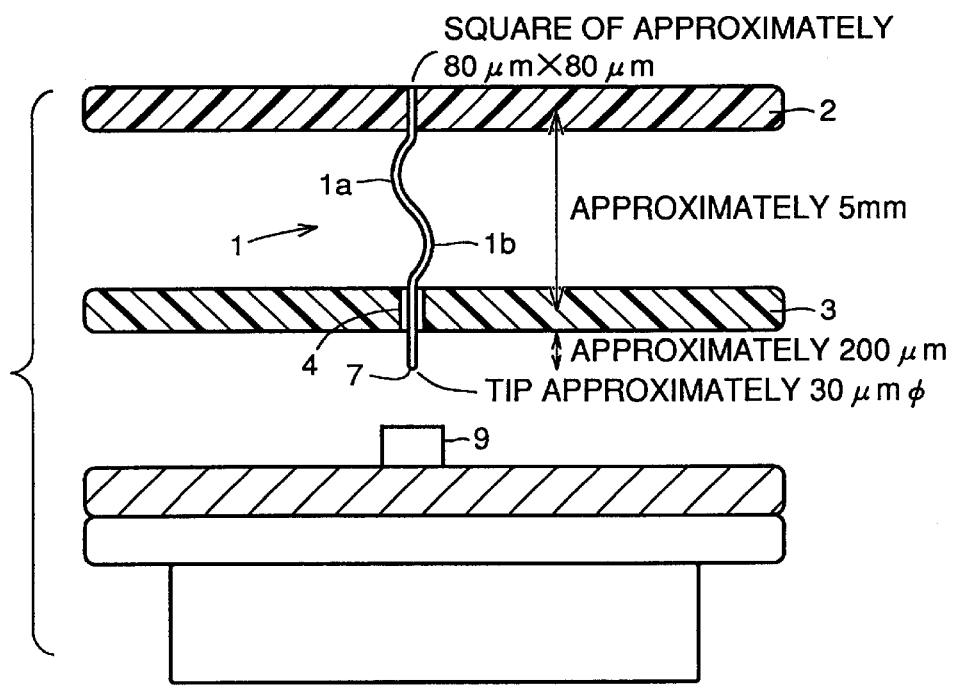
FIG. 1 is a schematic diagram showing a vertical needle type probe card according to a first embodiment of the present invention.
Figure 2:
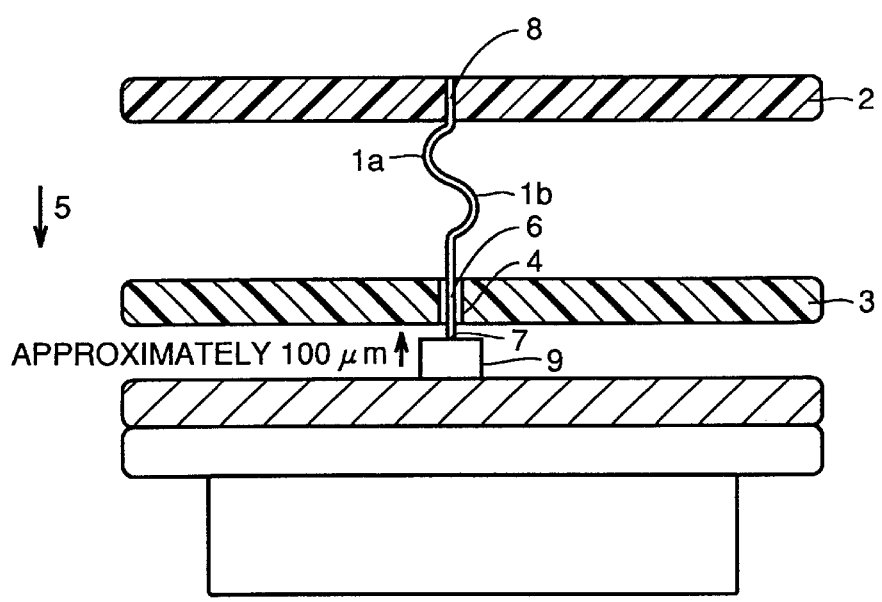
FIG. 2 is a schematic diagram of the vertical needle type probe card of the first embodiment in a usage state.
Figure 3:
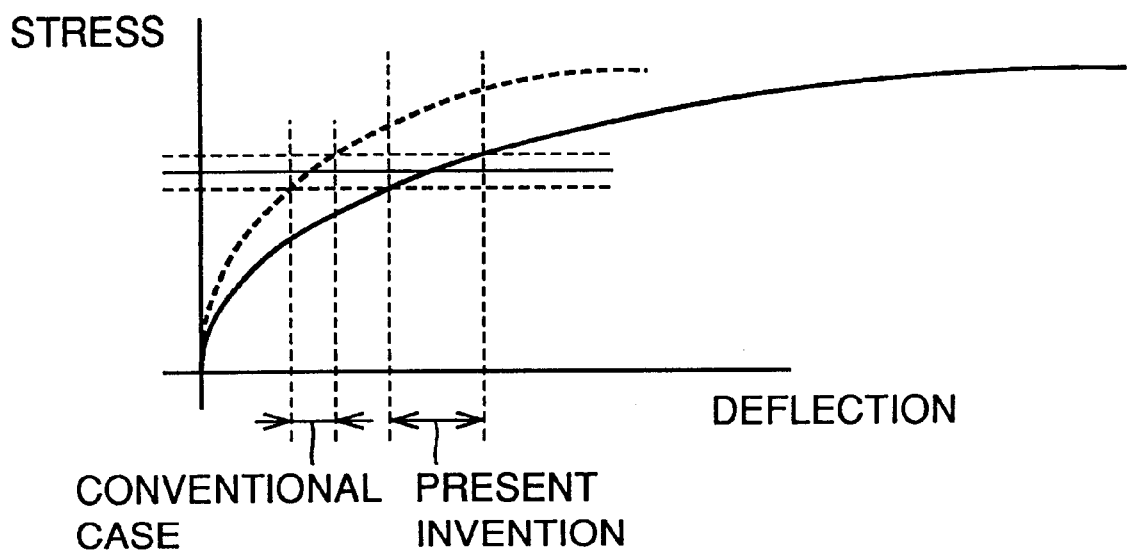
FIG. 3 is a graph showing the relationship between the stress and displacement at the time of usage of the probe needle of the vertical needle type probe card of the first embodiment.
Figure 4:
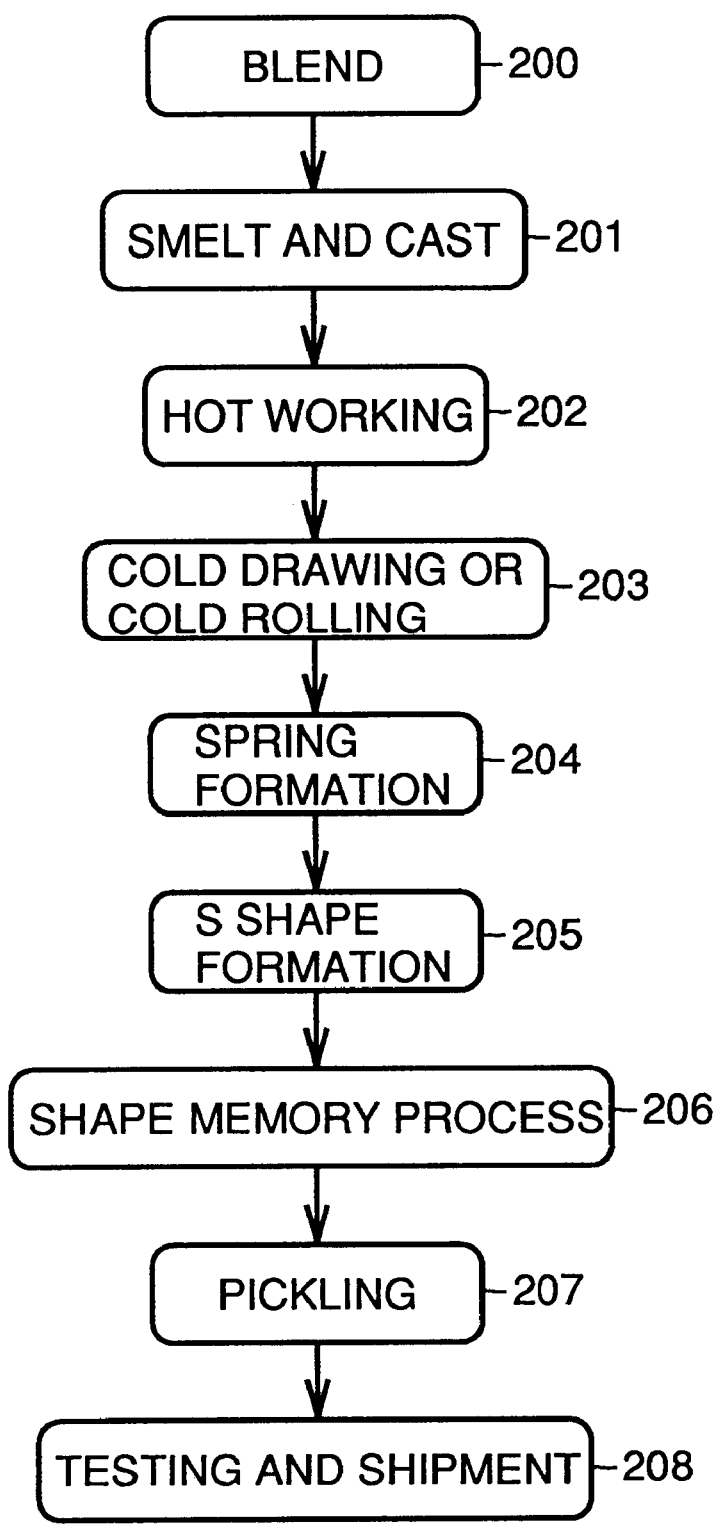
FIG. 4 shows a fabrication method of a probe needle of the vertical needle type probe card according to the first embodiment.

Referring to FIGS. 1 and 2, a probe card according to a first embodiment of the present invention has a vertical needle type probe needle 1 attached to an upper guide plate 2 with an upper end in the vertical direction. Probe needle 1 has a S shape including a first bending portion 1a and a second bending portion 1b. First bending portion 1a is formed so as to bend in a first lateral direction. Second bending portion 1b is formed to bend towards a second lateral direction opposite to the first lateral direction at substantially 180 degrees from the first lateral direction. A lower guide plate 3 for determining the position of probe needle 1 with respect to an electrode 9 that forms contact with probe needle 1 is located beneath upper guide plate. A through hole 4 for guiding probe needle 1 is formed in lower guide plate 3. Probe needle 1 is connected to a terminal (not shown) arranged around upper guide plate 2 via a wiring (not shown).

Figure 8:
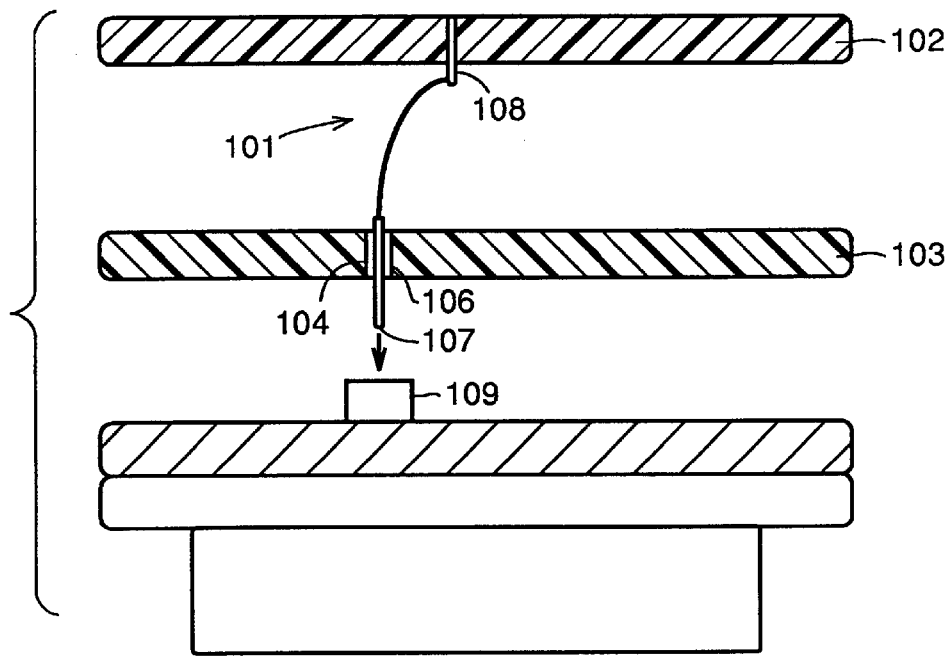
FIG. 8 is a schematic diagram showing a probe card having a conventional cobra probe needle installed.
Figure 9:
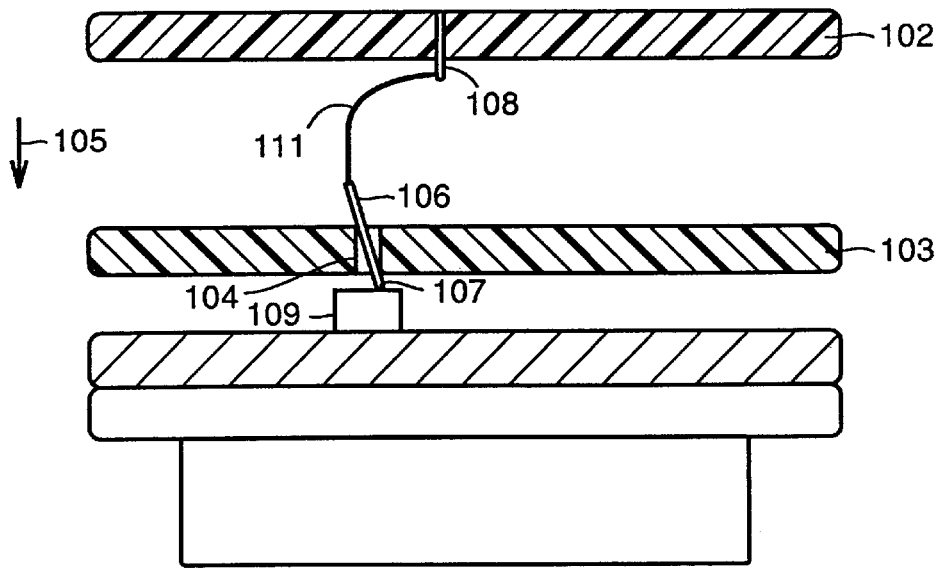
FIG. 9 is a schematic diagram of a probe card installed with a conventional cobra probe needle in a usage state.

Referring to FIG. 2, external stress 5 exerted towards this probe card is indicated by the arrow in FIG. 2. When leading end 7 of probe needle 1 forms contact with electrode 9, a portion 8 of probe needle 1 fastened to upper guide plate 2, a portion 6 of probe needle 1 guided through lower guide plate 3, first bending portion 1a and second bending portion 1b absorbing the stress, and leading end 7 of probe needle 1 in contact with electrode 9 are arranged as shown in FIG. 2. By this S shape of first and second bending portions 1a and 1b, deflection occurs substantially equally in left and right directions, in contrast to the concentrated deflection in conventional cobra probe needle 101 shown in FIG. 8. Leading end 7 of probe needle 1 can be effectively prevented from being inclined. As a result, various disadvantages caused by the inclination of leading end 7 can be eliminated.

Since probe needle 1 of the first embodiment has two bending portions 1a and 1b that form a S shape, the stress on probe needle 1 can be absorbed substantially equally in left and right directions at two locations. In the case where the stress on leading end 7 of probe needle 1 is increased identically for both probe needle 1 of the present invention and probe needle 1 of the conventional cobra type, the amount of deflection is greater for probe needle 1 of the present invention than the conventional cobra type probe needle. Therefore, probe needle 1 is deflected within the same axis, so that a vertical state can be maintained with respect to the guide plate. As a result, the deviation of leading end 7 in the horizontal direction becomes smaller. Also, the stress per one location on probe needle 1 becomes smaller since the amount of deflection is greater.

Probe needle 1 is formed of a thread body or a sheet strip. Therefore, the portion of probe needle 1 absorbing the stress can be provided in a thread-like or sheet-like form. When the portion absorbing the stress takes a thread-like configuration, the bending process is facilitated to shorten the time required for fabrication. When the portion absorbing the stress takes a sheet-like configuration, deflection occurs only in one direction in response to the bending stress. By setting this deflection in a direction where there is no adjacent probe needle, the possibility of a deflected probe needle 1 forming contact with another adjacent probe needle can be eliminated.

The fabrication method of probe needle 1 of the first embodiment includes a step 200 for blending at least two types of metals to form probe needle 1, a step 201 for smelting and casting the mixed metals, a step 202 for hot-working the cast metal, a step 203 for cold drawing or cold rolling the hot-worked metal, a step 204 for spring-forming the cold drawn or rolled metal, a step 205 for sintering the spring-formed metal into a S form, a step 206 for applying a heat treatment to the S shape metal so as to include shape memory property, a step 207 for pickling the metal subjected to the shape memory process, and a step 208 for testing and shipping the pickled metal. The fabrication process is characterized in including step 205 to form a S shape and step 206 to apply a shape memory process. These steps allow probe needle 1 to be manipulated while maintaining a straight state when probe needle 1 is inserted into upper guide plate 2 and lower guide plate 3, or when pulling out probe needle 1 from upper guide plate 2 and lower guide plate 3. Probe needle 1 can be restored to the S shape by applying a heat treatment after installation.

Second Embodiment

Figure 5:
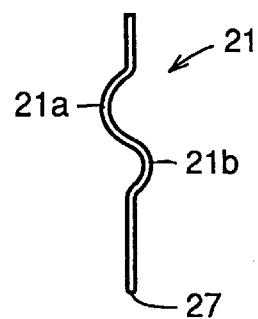
FIGS. 5, 6, and 7 show the configuration of a probe needle of a vertical needle type probe card according to second, third and fourth embodiments, respectively, of the present invention.

The state of installation and usage of a probe needle 21 according to a second embodiment of the present invention is similar to that of probe needle 1 according to the first embodiment shown in FIGS. 1 and 2. Referring to FIG. 5, probe needle 21 of the second embodiment has the radius of curvature of a second bending portion 21b that is located at the lower side set smaller than the radius of curvature of a first bending portion 21a located at the upper side. The rigidity of probe needle 21 can be increased than the case where second bending portion 21b is identical to first bending portion 21a in size. As a result, deviation of a leading end 27 generated by the contact pressure when probe needle 21 forms contact with electrode 9 becomes smaller than that of the S-shape probe needle 1 of the first embodiment having first and second bending portions 1a and 1b of the same size.

Third Embodiment

Figure 6:
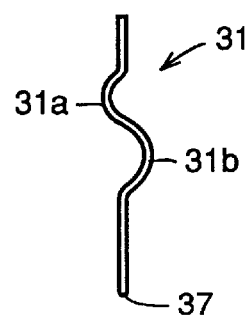

The state of installation and usage of a probe needle 31 according to a third embodiment of the present invention is similar to that of probe needle 1 of the first embodiment shown in FIGS. 1 and 2. Referring to FIG. 6, probe needle 31 of the third embodiment has the radius of curvature of a first bending portion 31a located at the upper side set smaller than the radius of curvature of a second bending portion 31b at the lower side. Accordingly, the rigidity of probe needle 31 can be increased than the case where first and second bending portion 31a and 31b are of the same size. In contrast to probe needle 21 of the second embodiment, probe needle 31 of the third embodiment has the bending portion of the greater radius of curvature (second bending portion 31b) located at the lower side. Therefore, the distance from the bending portion of the greater radius of curvature (second bending portion 31b) to leading end 37 is reduced. In general, the bending portion of a greater radius of curvature is more easily bent than a bending portion of a smaller radius of curvature. This means that the inclination of leading end 37 becomes smaller when the bending portion of a greater radius of curvature is closer to leading end 37 of the probe needle than when located remote from leading end 37 of the probe needle. In probe needle 31 according to the third embodiment, bending portion 31b of the greater radius of curvature is located at the side closer to leading end 37. Therefore, deviation of leading end portion 37 caused by the contact pressure when probe needle 31 comes into contact with electrode 9 becomes smaller than that of probe needle 21 according to the second embodiment.

Fourth Embodiment

Figure 7:
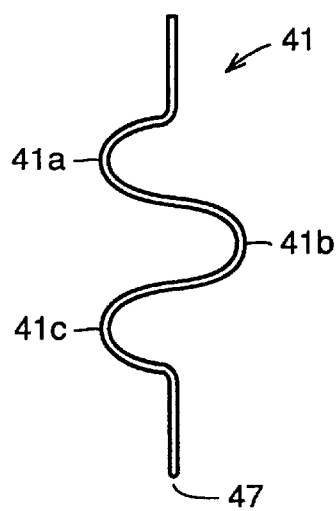

The state of installation and usage of a probe needle 41 according to a fourth embodiment of the present invention is similar to that of probe needle 1 of the first embodiment shown in FIGS. 1 and 2. Referring to FIG. 7, a vertical type probe needle 41 according to the fourth embodiment of the present invention is formed in a W-shape configuration including a first bending portion 41a, a second bending portion 41b, and a third bending portion 41c. Probe needle 41 can have the stress exerted on leading end 47 absorbed by the three locations of first bending portion 41a, second bending portion 41b, and third bending portion 41c. Therefore, the rigidity of probe needle 41 becomes higher than that of probe needles 1, 21, and 31 of the first, second and third embodiments, respectively. As a result, deviation of leading end 47 caused by the contact pressure when probe needle 41 is brought into contact with electrode 9 becomes further smaller than that of probe needles 1, 21, and 31.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A probe needle assembly for a vertical needle type probe card, comprising:
    an upper guide plate:
    a needle guide plate having a through hole; and
    a needle having:
        an upper end portion attached to the upper guide plate;
        a needle end portion extending through said through hole of the needle guide plate; and
        a bending portion having a first bending portion bent towards a first lateral direction, and a second bending portion bent towards a second lateral direction opposite to said first lateral direction at substantially 180 degree to said first lateral direction, said second bending portion connected to said needle end portion, said first and second bending portions having radii of curvature differing from each other,
    wherein said first and second bending portions become further bent toward said first and second lateral directions, respectively, to tolerate pressure applied to said needle end portion.

2. The probe needle for a vertical needle type probe card according to claim 1, wherein said radius of curvature of said first bending portion is greater than said radius of curvature of said second bending portion.

3. The probe needle for a vertical needle type probe card according to claim 1 wherein at least said first and second bending portions are formed of a sheet strip.

4. The probe needle for a vertical needle type probe card according to claim 1, wherein said first and second bending portions have a bending configuration of one of substantially a S shape and substantially a W shape.

5. The probe needle for a vertical needle type probe card according to claim 1, wherein at least said first and second bending portions are formed of a metal having shape memory property.

6. A method of fabricating a probe needle for a vertical needle type probe card, comprising the steps of:

smelting and casting at least two types of metals;

sintering and molding said cast metal so as to include a first bending portion bent towards a first lateral direction and a second bending portion bent towards a second lateral direction opposite to said first lateral direction at substantially 180 degrees to said first lateral direction; and applying a heat treatment on said cast metal to have shape memory property.

* * * * *

UNITED STATES PATENT AND TRADEMARK OFFICE
CERTIFICATE OF CORRECTION

PATENT NO. : 6,242,929 B1
DATED : June 5, 2001
INVENTOR(S) : Masaharu Mizuta

It is certified that error appears in the above-identified patent and that said Letters Patent is hereby corrected as shown below:

<u>Claims,</u>
Delete Claim 6.

Signed and Sealed this

Twenty-sixth Day of March, 2002

Attest:

Attesting Officer

JAMES E. ROGAN
*Director of the United States Patent and Trademark Office*